United States Patent [19]
Suzuki

[11] Patent Number: 5,034,971
[45] Date of Patent: Jul. 23, 1991

[54] MASK FOR X-RAY LITHOGRAPHY

[75] Inventor: Kunio Suzuki, Hamamatsu, Japan

[73] Assignee: Yamaha Corporation, Japan

[21] Appl. No.: 471,848

[22] Filed: Jan. 29, 1990

[30] Foreign Application Priority Data

Jan. 31, 1989 [JP] Japan .................................. 1-21954

[51] Int. Cl.$^5$ ........................ G21K 5/00; G01N 23/04
[52] U.S. Cl. ........................................ 378/35; 378/34; 378/62
[58] Field of Search ............................ 378/34, 35, 62

[56] References Cited

U.S. PATENT DOCUMENTS 4,536,882  8/1985  Jones et al. ............................ 378/35
4,735,877  4/1988  Kato et al. ............................. 378/35

FOREIGN PATENT DOCUMENTS 0015256  2/1980  Japan .................................. 378/035

*Primary Examiner*—Constantine Hannaher
*Assistant Examiner*—Don Wong
*Attorney, Agent, or Firm*—Ostrolenk, Faber, Gerb & Soffen

[57] ABSTRACT

In composition of a mask for X-ray lithography made up of a substrate and one or more metallic pattern layer of high soft X-ray absorption, conventional ceramic for the substrate is replaced by Be. High X-ray permeability of Be allows use of a thick construction for the substrate, thereby raising mechanical properties of the mask and assuring clear contrast in X-ray exposure of resist. Closeness in thermal expansion between the substrate and the pattern layer precludes the danger of undesirable separation, warping and breakage.

5 Claims, 1 Drawing Sheet

MASK FOR X-RAY LITHOGRAPHY

BACKGROUND OF THE INVENTION

The present invention relates to a mask x-ray lithography, and more particularly relates to improvement in x-ray permeability and mechanical properties of a mask made up of a substrate and at least one pattern layer and used for x-ray lithography.

In a typical construction of a mask used for this purpose, at least one pattern layer is deposited on a substrate in a prescribed design. Conventionally, the pattern layer is in the thickness of 0.1 to 0.5 $\mu$m and made of a metal of high soft x-ray absorption such as Ag and W. (It is said that the wave length of the soft x-ray is 4 through 14Å). Whereas the substrates is in the thickness of several $\mu$m and made of a ceramic of relatively high soft x-ray permeability such as BN, $Si_3N_4$, SiC and $SiO_2$.

The conventional mask of the above-described composition is inevitably accompanied with several fatal demerits. In the first place, the x-ray permeability of the ceramic used for the substrate is not high enough to allow substantially full permeation of the soft x-ray radiated and negligible part of the soft x-ray radiated is absorbed by the substrate. As a result, the ratio of permeation between the permeable region (the substrate only) and the impermeable region (the substrate covered by the pattern layer) is not high enough to provide a clear contrast. In order to raise this ratio of permeation, it is thinkable to decrease the thickness of the substrate. Such reduction in thickness of the substrate inevitably would lead to lowering in mechanical strength of the mask. In addition, undersirable warp would be developed in the substrate by x-ray radiation.

Since the materials for the substrate and the pattern layer are both given in the form of compounds, the materials tend to change their physical by long period x-ray radiation. Further, the substrate ceramic and the pattern layer made of metal are significantly different in degree of thermal expansion and, as a consequence, they exhibit poor coordination in physical behavior when heated.

SUMMARY OF THE INVENTION

It is the object of the present invention to provide a mask for x-ray lithography which assures high mechanical strength, clear contrast and rich coordination.

In accordance with the present invention, the substrate of the x-ray mask is made of Be and the thickness of the substrate in such that the ratio of permeability between a permeable region formed solely by the substrate and an impermeable region formed by the substrate covered by the pattern layer is 2 or larger.

DESCRIPTION OF THE PREFERRED EMBODIMENT

Figure 1:
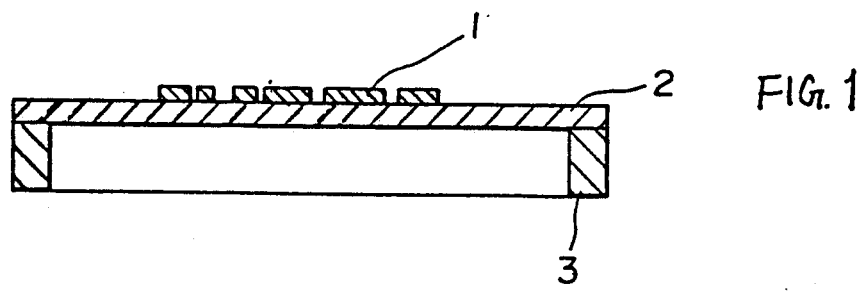
FIG. 1 is a sectional side view of one embodiment of the X-ray mask in accordance with the present invention.

One embodiment of the X-ray mask in accordance with the present invention is shown in FIG. 1 in which the mask includes a substrate 2 mounted to a frame 3 and pattern layer 1 deposited on the substrate 2 in a prescribed design.

The pattern layer 1 is in the thickness of 0.1 to 0.5$\mu$ and made of a metal of high soft X-ray absorption such as Au, Mo, W, Pt or Ta.

The substrate 2 is made of a metal of Be in the thickness of 0.5 to 100 $\mu$m, more preferably 3 to 15 $\mu$m. Any thickness below 0.5 $\mu$m would not provide mechanical strength necessary for supporting the pattern layer. Whereas low soft X-ray permeability would be caused by any thickness exceeding 100 $\mu$m.

The frame 3 is circular or square in shape and made of a metal such as Si, Cu or Ni. The thickness of the frame 3 is preferably in a range from 0.5 to 0 mm. The frame 3 is used for easy holding of the mask in X-ray exposure.

In accordance with the present invention, the thickness of the substrate 2 is chosen so that the ratio of permeation between the permeable region (the substrate 2 only) and the impermeable region (the substrate 2 covered with the pattern layer 1) should be 2 or larger. No clear contrast can be obtained when the ratio of permeation falls short of 2. Whereas no increase in contrast can be expected if the ratio exceeds 20. In one practical example, the thickness of the pattern layer 1 is 0.1 $\mu$m when the ratio of permeation is equal to 2, the thickness of the Be substrate 2 is 10 $\mu$m and the wave length of the X-ray radiated is 0.989 nm. The thickness ratio is swayed by the wave length of the X-ray used for radiation. By use of a mask of this specification in resist image exposure on a wafer, high degree of resolution can be expected with a short exposure period.

Thanks to the high soft X-ray permeation of Be, the substrate 2 is allowed to have a thick construction. In fact, the soft X-ray permeation of Be is about 5 times larger than that of BN and about 8 times larger than that of $Si_3N_4$.

It is generally said that the ratio of permeation of a mask used for this purpose should preferably be 10 or larger. When the permeation of the permeable region of such a mask is 60%, that of the impermeable region is 6%. When Au is used for the pattern layer 1 under this condition, its resultant thickness is 0.33 $\mu$m. Then when $Si_3N_4$ is used for the substrate 2, its thickness is 1.4 $\mu$m. When BN is used for the substrate 2, its thickness is 2.3 $\mu$m. In contract with these, use of Be for the substrate 2 results in the thickness value of 11.2 $\mu$m. Thus, a very thick construction is empolyable in the case of the mask in accordance with the present invention.

The degree of thermal expansion of Be is $13.0 \times 10^{-6}/°$ C. which is very close to that of Au used for the pattern layer ($14.2 \times 10^{-6}/°$ C.) and, as a consequence, there is a good coordination in thermal expansion. The degree of thermal expansion of BN is $1.0 \times 10^{-6}/°$ C. and that of $Si_3N_4$ is $2.9 \times 10^{-6}/°$ C. Such big difference in degree of thermal expansion would tend to cause undesirable separation, warping and deformation of the mask.

Since Be is electrically conductive, the plating process can be employed for formation of the pattern layer 1. In addition, since Be is a simple substance, no substantial change in physical property is caused even by long period X-ray radiation.

In production of the mask in accordance with the present invention, a metal plate made of Si, Cu or Ni is used for the frame 3. Next, the substrate 2 is formed on the surface of the frame 3 by vacuum deposition or spattering or plating of Be. In a same method, a metal thin film for the pattern layer 1 is formed on the surface of the substrate 2 using Au, Mo or W. The surface of this metal thin film is coated with resist and a pattern, a resist image, is formed by radiation of electron beam. Then, the pattern layer 1 is formed by application of proper etching. Finally the center part of the metal plate for the frame 3 is removed by etching with, for example, nitric acid solution.

In an alternative way of production, a Be wafer prepared by, for example, rolling is bonded to the surface of a frame 3 via welding to form the substrate 2. As in the above-described method, the pattern layer 1 is formed on the substrate 2 via vacuum deposition or spattering.

In accordance with the present invention, increased thickness of the substrate accruing from use of Be raises the mechanical properaties of the mask significantly with clear contrast resulted from the large ratio of permeation between the permeable region and the impermeable region of the mask. Use of a simple substance for the substrate caused substantially no change in physical properties even by long period X-ray radiation. Good coordination is physical behavior between the substrate and the pattern layer are also assured.

I claim:
1. A mask for X-ray lithography, comprising:
a substrate made of Be, and
at least one pattern layer deposited on said substrate, wherein the thickness of said substrate is such that the ratio of permeability between a permeable region formed solely by said substrate and an impermeable region formed by said substrate covered by said pattern layer is 2 or larger.
2. A mask as claimed in claim 1 in which the thickness of said substrate is in a range from 0.5 to 100 μm.
3. A mask as claimed in claim 1 in which said pattern layer is made of a material chosen from a group consisting of Au, W, Mo, Pt and Ta.
4. A mask as claimed in claim 2 in which said pattern layer is made of a material chosen from a group consisting of Au, W, Mo, Pt and Ta.
5. A mask as claimed in claim 2 in which the thickness of said substrate is in a range from 3 to 15 μm.

* * * * *